United States Patent
Choi et al.

(10) Patent No.: US 11,121,069 B2
(45) Date of Patent: Sep. 14, 2021

(54) SEMICONDUCTOR PACKAGE INCLUDING CAPPING PAD HAVING CRYSTAL GRAIN OF DIFFERENT SIZE

(71) Applicant: SAMSUNG ELECTRONICS CO., LTD., Suwon-si (KR)

(72) Inventors: Jaehoon Choi, Suwon-si (KR); Doohwan Lee, Suwon-si (KR); Byungho Kim, Suwon-si (KR); Jooyoung Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 22 days.

(21) Appl. No.: 16/580,480

(22) Filed: Sep. 24, 2019

(65) Prior Publication Data

US 2020/0152565 A1    May 14, 2020

(30) Foreign Application Priority Data

Nov. 13, 2018 (KR) ........................ 10-2018-0138678

(51) Int. Cl.
*H01L 23/498* (2006.01)
*H01L 23/00* (2006.01)
(Continued)

(52) U.S. Cl.
CPC .... *H01L 23/49838* (2013.01); *H01L 21/4857* (2013.01); *H01L 23/13* (2013.01);
(Continued)

(58) Field of Classification Search
CPC .......... H01L 23/49838; H01L 23/3128; H01L 23/13; H01L 23/49822; H01L 24/05;
(Continued)

(56) References Cited

U.S. PATENT DOCUMENTS 7,351,654 B2 * 4/2008 Komatsu ........... H01L 21/28525
257/E21.166
9,520,372 B1 12/2016 Jeng et al.
(Continued)

FOREIGN PATENT DOCUMENTS

JP    2008218529 A    9/2008
JP    2008-235786 A    10/2008
(Continued)

OTHER PUBLICATIONS

Communication dated Aug. 19, 2020, issued by the Korean Intellectual Property Office in counterpart Korean Application No. 10-2018-0138678.

Primary Examiner — Khiem D Nguyen
(74) Attorney, Agent, or Firm — Sughrue Mion, PLLC

(57) ABSTRACT

A semiconductor package includes a semiconductor chip including a connection pad disposed on an active surface of the semiconductor chip, a passivation layer disposed on the connection pad and the active surface and having an opening exposing at least a portion of the connection pad, and a capping pad covering the connection pad exposed to the opening; an encapsulant covering at least a portion of the semiconductor chip; and a connection structure disposed on the active surface of the semiconductor chip and including a connection via connected to the capping pad and a redistribution layer connected to the connection via, wherein the capping pad includes: a central portion disposed in the opening, and a peripheral portion extending from the central portion onto the passivation layer, and having a crystal grain having a size different from that of the crystal grain of the central portion.

20 Claims, 12 Drawing Sheets

(51) Int. Cl.
*H01L 23/31* (2006.01)
*H01L 23/13* (2006.01)
*H01L 21/48* (2006.01)

(52) U.S. Cl.
CPC .... *H01L 23/3128* (2013.01); *H01L 23/49816* (2013.01); *H01L 23/49822* (2013.01); *H01L 24/05* (2013.01); *H01L 24/08* (2013.01); *H01L 24/19* (2013.01); *H01L 24/20* (2013.01); *H01L 2224/05624* (2013.01); *H01L 2224/05647* (2013.01); *H01L 2224/08238* (2013.01)

(58) Field of Classification Search
CPC ......... H01L 24/06; H01L 24/08; H01L 24/20; H01L 2224/16; H01L 2224/0401; H01L 2224/73204; H01L 2224/04105; H01L 2224/12105; H01L 2224/02379; H01L 2224/0235; H01L 2224/05008; H01L 2224/05569; H01L 2224/08238; H01L 24/19; H01L 23/49816; H01L 23/5389; H01L 2224/023
See application file for complete search history.

(56) References Cited

U.S. PATENT DOCUMENTS

| | | | |
|---|---|---|---|
| 2008/0203578 A1 | 8/2008 | Nakasato et al. | |
| 2008/0230899 A1 | 9/2008 | Amatatsu et al. | |
| 2011/0017990 A1* | 1/2011 | Son | H01L 29/7869 257/43 |
| 2012/0047731 A1* | 3/2012 | Murakami | H05K 3/4644 29/852 |
| 2013/0069238 A1* | 3/2013 | Usami | H01L 23/53257 257/769 |
| 2015/0061115 A1* | 3/2015 | Chen | H01L 24/11 257/737 |
| 2017/0154838 A1* | 6/2017 | Kim | H01L 23/485 |
| 2017/0271242 A1* | 9/2017 | Lo | H01L 21/76898 |
| 2017/0365567 A1 | 12/2017 | Kim et al. | |
| 2018/0361456 A1* | 12/2018 | Kubo | C21D 9/48 |

FOREIGN PATENT DOCUMENTS

| | | |
|---|---|---|
| KR | 10-2011-0020484 A | 3/2011 |
| KR | 10-2017-0061370 A | 6/2017 |
| KR | 1020170142812 A | 12/2017 |

\* cited by examiner

SEMICONDUCTOR PACKAGE INCLUDING CAPPING PAD HAVING CRYSTAL GRAIN OF DIFFERENT SIZE

CROSS-REFERENCE TO RELATED APPLICATION(S)

This application claims the benefit of priority to Korean Patent Application No. 10-2018-0138678 filed on Nov. 13, 2018 in the Korean Intellectual Property Office, the entire disclosure of which is incorporated herein by reference.

TECHNICAL FIELD

The present disclosure relates to a semiconductor package, and more particularly, to a fan-out semiconductor package.

BACKGROUND

A significant recent trend in the development of technology related to semiconductor chips has been to reduce the size of semiconductor chips. Therefore, in the field of package technology, in accordance with a rapid increase in demand for small-sized semiconductor chips, or the like, the implementation of a semiconductor package having a compact size while including a plurality of fins has been demanded. One type of package technology suggested to satisfy the technical demand as described above is a fan-out package. Such a fan-out package has a compact size and may allow a plurality of fins to be implemented by redistributing connection terminals outwardly of a region in which a semiconductor chip is disposed.

Meanwhile, in the case of the semiconductor chip, a material of connection pads is aluminum (Al) or copper (Cu). In this case, in a process for manufacturing the package, the connection pads of the semiconductor chip are exposed to air, moisture, chemical solution, and the like, which causes corrosion and damage.

SUMMARY

An aspect of the present disclosure may provide a new semiconductor package structure that may significantly reduce corrosion and damage of connection pads of a semiconductor chip, and enable improvement in reliability and reduction in resistance distribution of connection vias.

According to an aspect of the present disclosure, a semiconductor package may be provided, in which a capping pad is disposed on a passivation layer having an opening exposing a connection pad of a semiconductor chip in a chip state before the semiconductor chip is packaged.

According to an aspect of the present disclosure, a semiconductor package may include a semiconductor chip including a connection pad disposed on an active surface of the semiconductor chip, a passivation layer disposed on the connection pad and the active surface and having an opening exposing at least a portion of the connection pad, and a capping pad covering the connection pad exposed to the opening; an encapsulant covering at least a portion of the semiconductor chip; and a connection structure disposed on the active surface of the semiconductor chip and including a connection via connected to the capping pad and a redistribution layer connected to the connection via, wherein the capping pad includes: a central portion disposed in the opening, and a peripheral portion extending from the central portion onto the passivation layer, and having a crystal grain having a size different from that of the crystal grain of the central portion.

According to another aspect of the present disclosure, a semiconductor package may include a semiconductor chip including a connection pad disposed on an active surface of the semiconductor chip, a passivation layer disposed on the connection pad and the active surface, and a capping pad covering a first portion of the connection pad; an encapsulant covering at least a portion of the semiconductor chip; and a connection structure disposed on the active surface of the semiconductor chip and including a connection via connected to the capping pad and a redistribution layer connected to the connection via, wherein the passivation layer has a stepped portion that covers a second portion of the connection pad, the stepped portion of the passivation layer is disposed between the second portion of the connection pad and the capping pad in a stacking direction, and a first portion of the capping pad in contact with the connection pad has a different size of a crystal grain than that of a second portion of the capping pad disposed directly below the stepped portion of the passivation layer in the stacking direction.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Electronic Device

Figure 1:
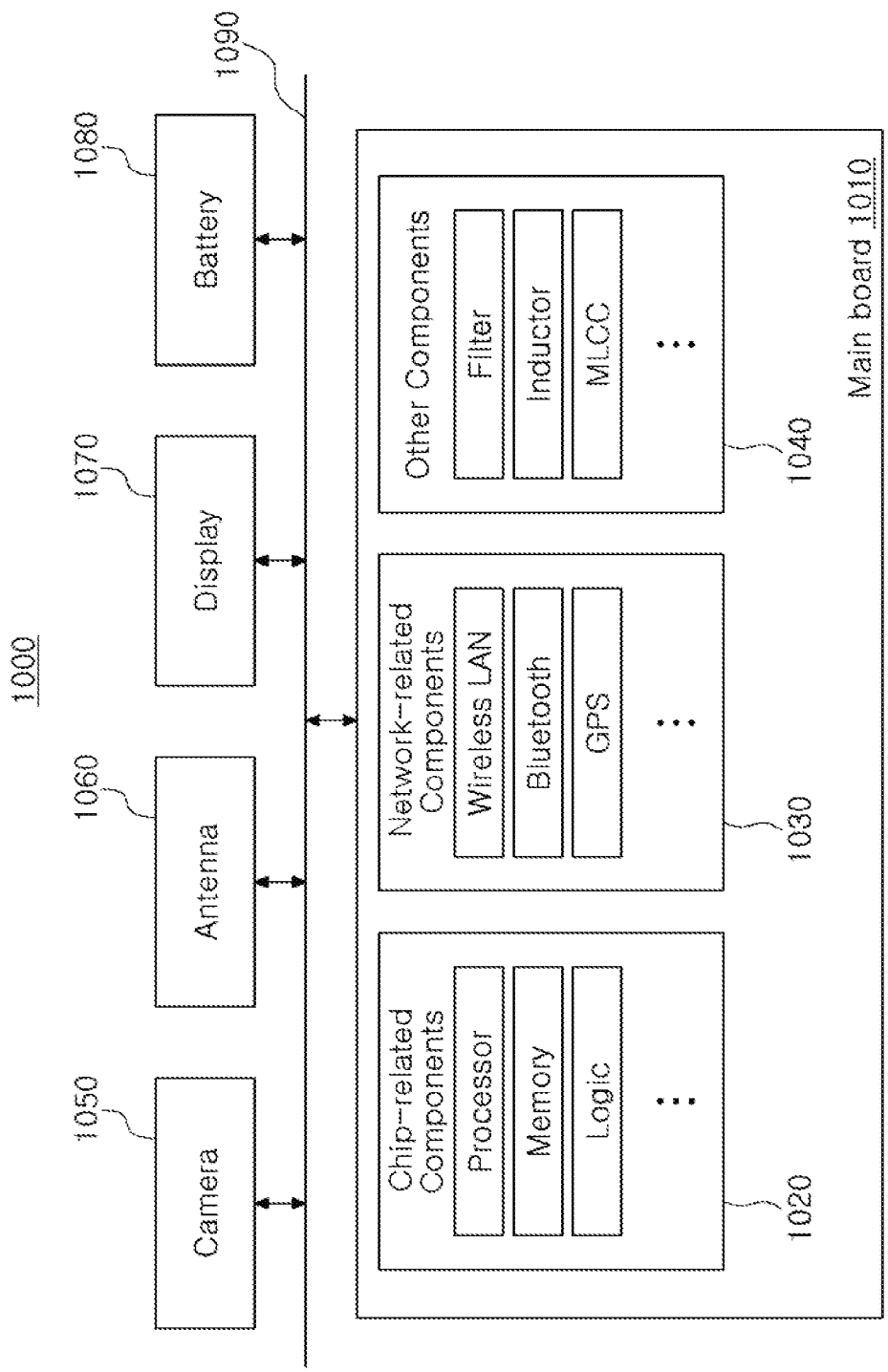
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
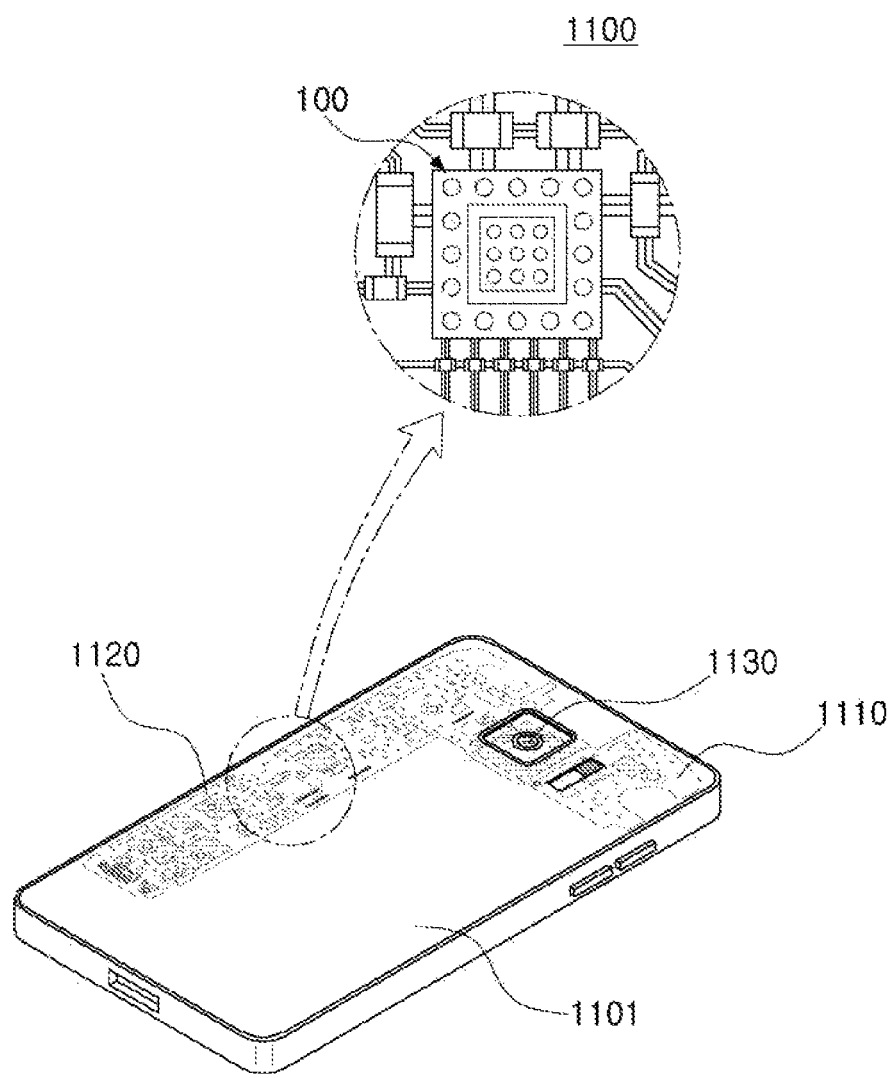
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a printed circuit board 1110 such as motherboard may be accommodated in a body 1101 of a smartphone 1100, and various electronic components 1120 may be physically or electrically connected to the printed circuit board 1110. In addition, other components that may or may not be physically or electrically connected to the printed circuit board 1110, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

Figure 3B:
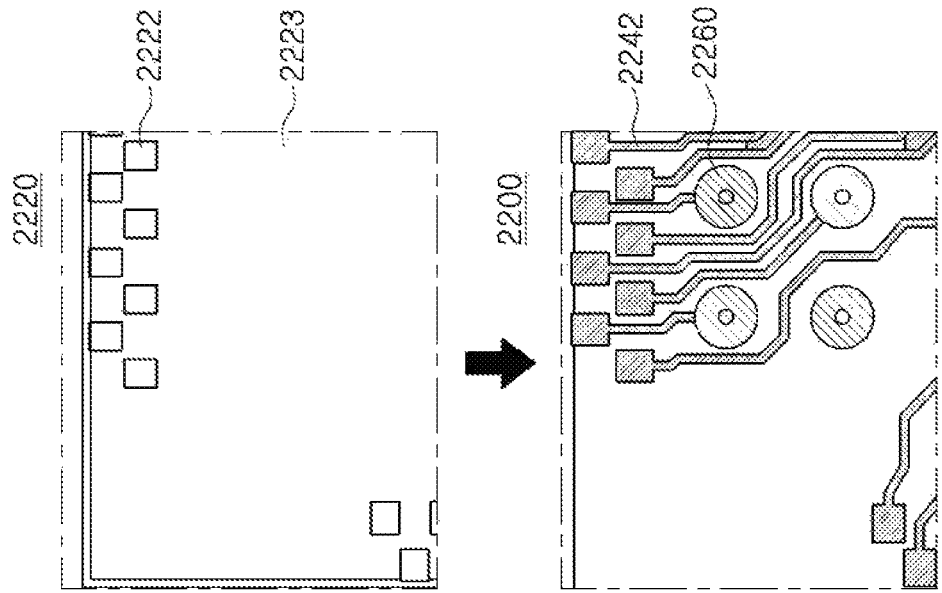
FIGS. 3A and 3B are schematic cross-sectional views illustrating states of a fan-in semiconductor package before and after being packaged.
Figure 3A:
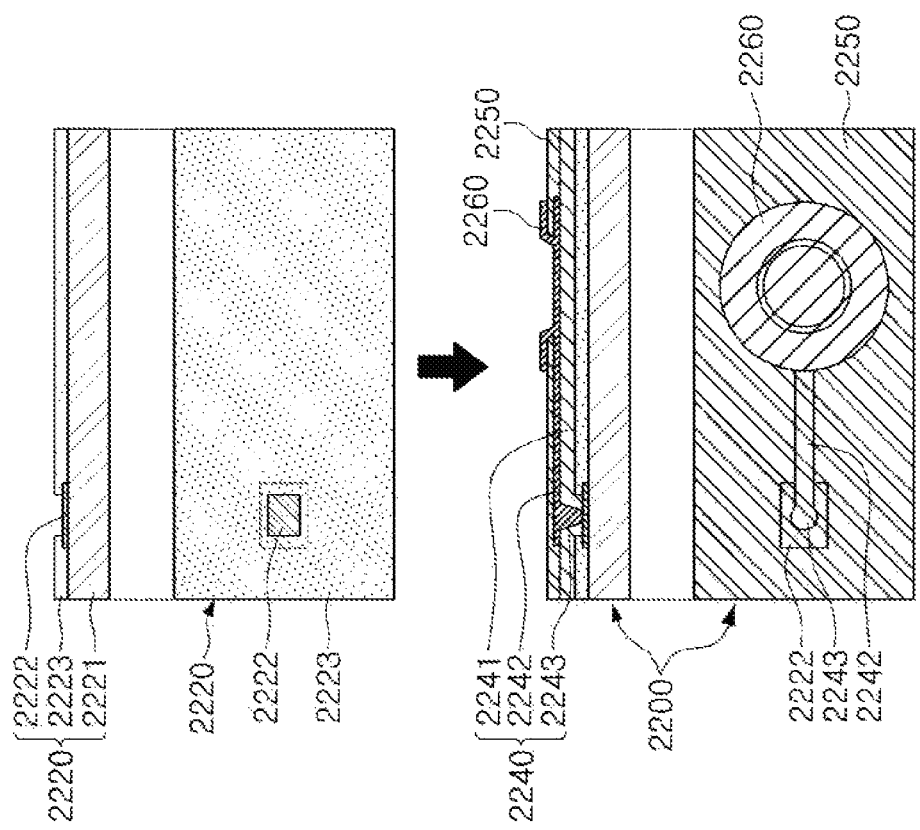

FIGS. 3A and 3B are schematic cross-sectional views illustrating states of a fan-in semiconductor package before and after being packaged.

Figure 4:
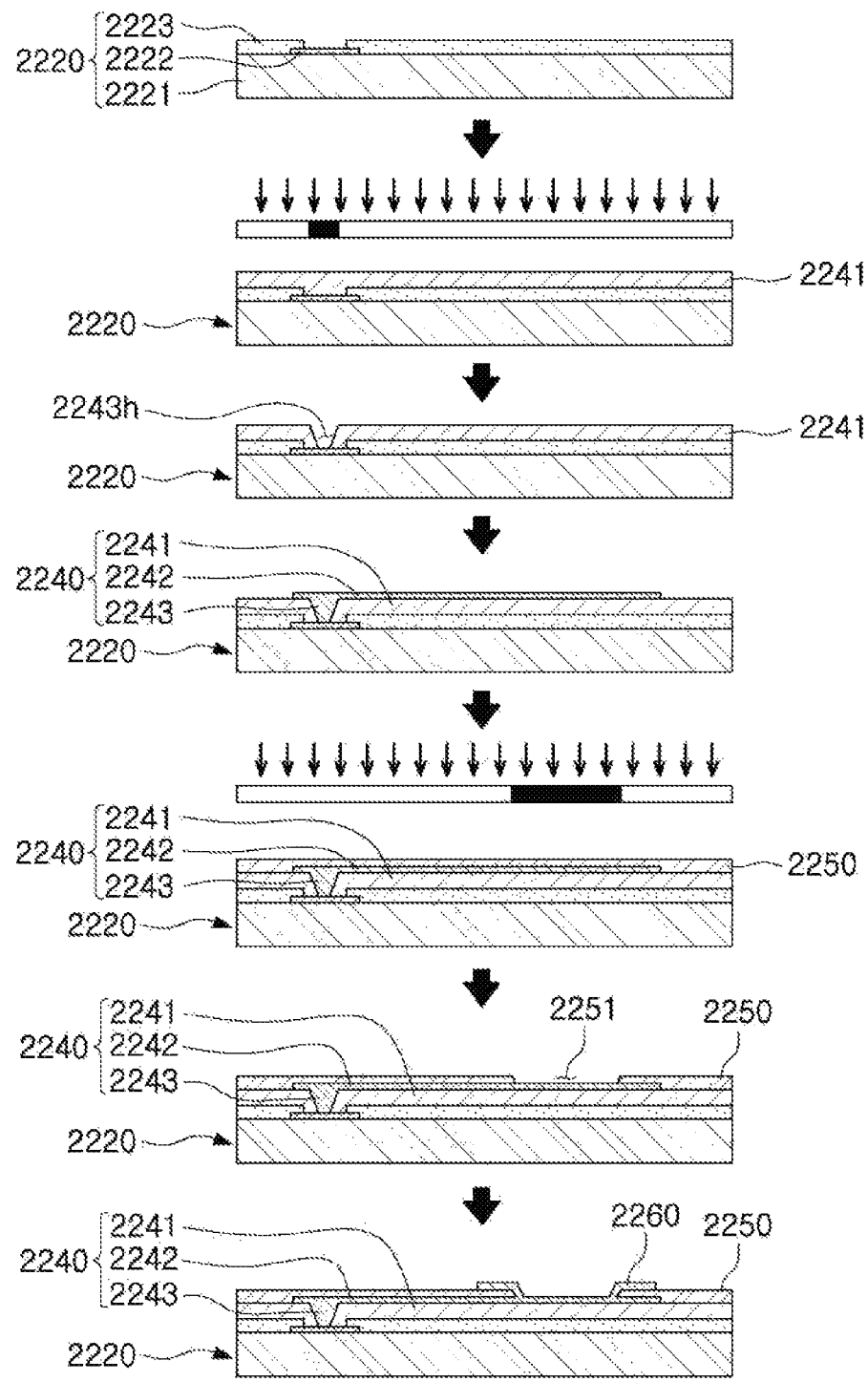
FIG. 4 is a schematic cross-sectional view illustrating a packaging process of a fan-in semiconductor package.

FIG. 4 is schematic cross-sectional views illustrating a packaging process of a fan-in semiconductor package.

Referring to FIGS. 3A to 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a metal material such as aluminum (Al), or the like, and a passivation layer 2223 such as an oxide layer, a nitride layer, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection structure 2240 may be formed depending on a size of the semiconductor chip 2220 on the semiconductor chip 2220 in order to redistribute the connection pads 2222. The connection structure 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection structure 2240 may be formed, an opening 2251 may be formed, and an underbump metal 2260, or the like, may be formed. That is, a fan-in semiconductor package 2200 including, for example, the semiconductor chip 2220, the connection structure 2240, the passivation layer 2250, and the underbump metal 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even though a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip are not enough to directly mount the fan-in semiconductor package on the mainboard of the electronic device.

Figure 5:
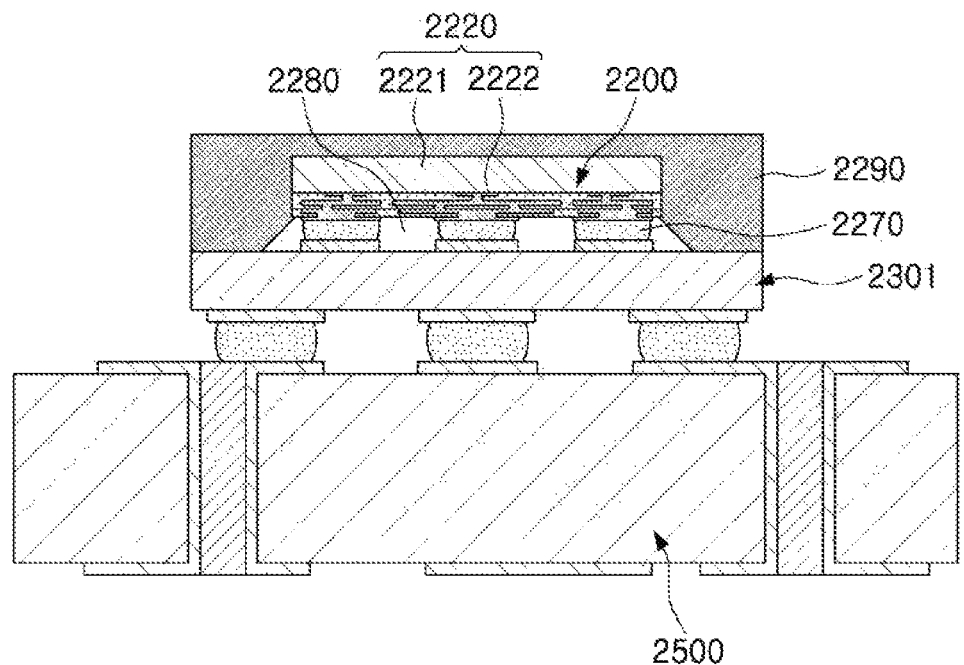
FIG. 5 is a schematic cross-sectional view illustrating a fan-in semiconductor package mounted on a printed circuit board that is ultimately mounted on a main board of an electronic device.

FIG. 5 is a schematic cross-sectional view illustrating a case in which a fan-in semiconductor package is mounted on a printed circuit board and is ultimately mounted on a mainboard of an electronic device.

Figure 6:
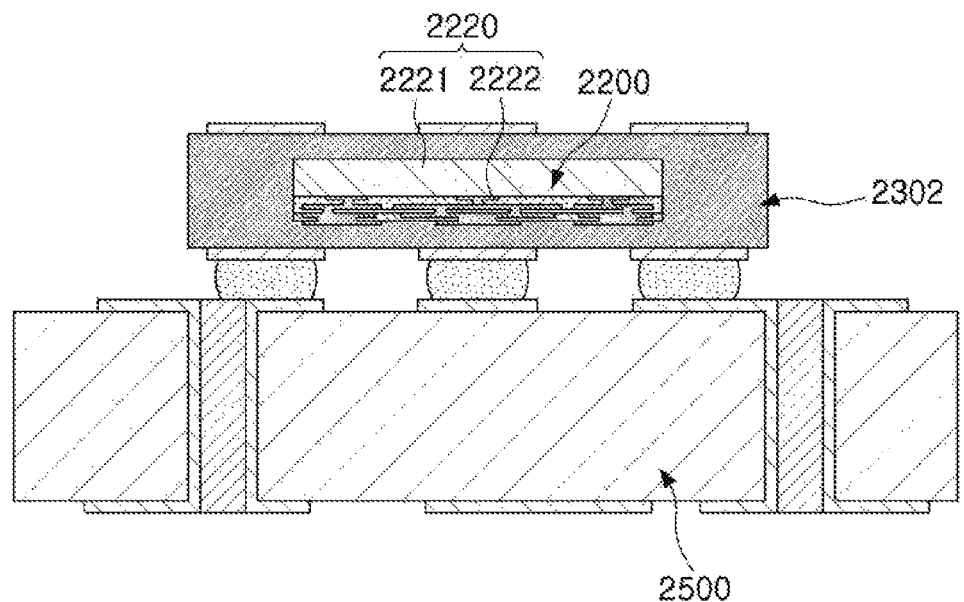
FIG. 6 is a schematic cross-sectional view illustrating a fan-in semiconductor package embedded in a printed circuit board that is ultimately mounted on a main board of an electronic device.

FIG. 6 is a schematic cross-sectional view illustrating a case in which a fan-in semiconductor package is embedded in a printed circuit board and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through a Printed circuit board 2301, and the fan-in semiconductor package 2200 may be ultimately mounted on a mainboard 2500 of an electronic device in a state in which it is mounted on the Printed circuit board 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate Printed circuit board 2302, connection pads 2222, that is, I/O terminals, of the semiconductor chip 2220 may be redistributed by the Printed circuit board 2302 in a state in which the fan-in semiconductor package 2200 is embedded in the Printed circuit board 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate Printed circuit board and be then mounted on the mainboard of the electronic device through a packaging process or may be mounted and used on the mainboard of the electronic device in a state in which it is embedded in the Printed circuit board.

Fan-Out Semiconductor Package

Figure 7:
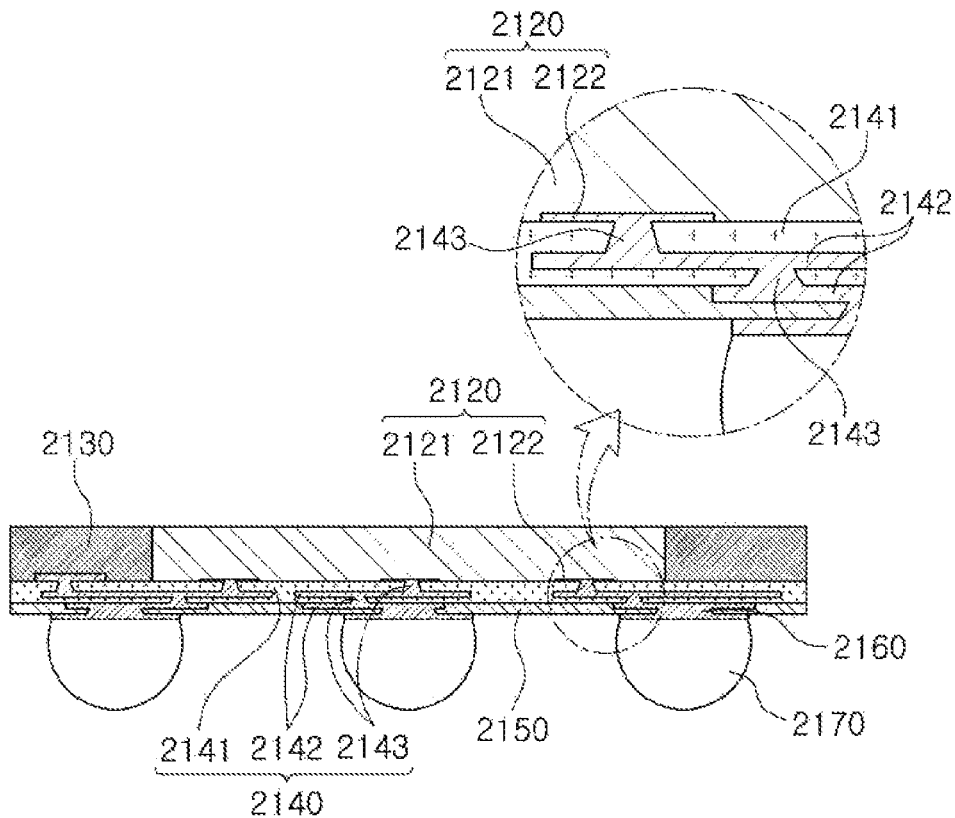
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection structure 2140. In this case, a passivation layer 2150 may further be formed on the connection structure 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, and the like. The connection structure 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection structure formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection structure formed on the semiconductor chip as described above. Therefore, even in a case in which a size of the semiconductor chip is decreased, a standardized ball layout may be used in the fan-out semiconductor package as it is, such that the fan-out semiconductor package may be mounted on the mainboard of the electronic device without using a separate Printed circuit board, as described below.

Figure 8:
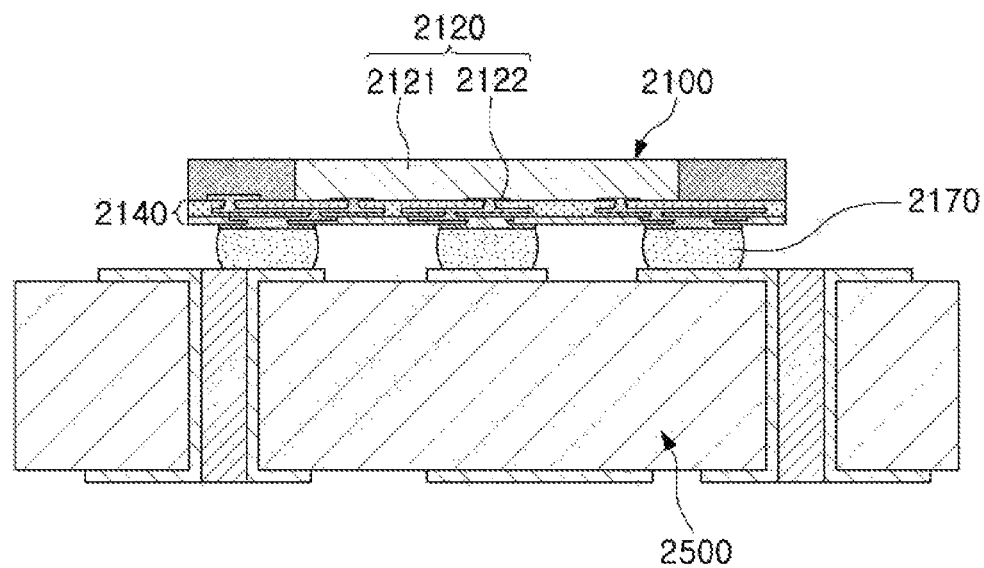
FIG. 8 is a schematic cross-sectional view illustrating a fan-out semiconductor package mounted on a main board of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection structure 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate Printed circuit board, or the like.

As described above, since the fan-out semiconductor package may be mounted on the mainboard of the electronic device without using the separate Printed circuit board, the fan-out semiconductor package may be implemented at a thickness lower than that of the fan-in semiconductor package using the Printed circuit board. Therefore, the fan-out semiconductor package may be miniaturized and thinned. In addition, the fan-out electronic component package has excellent thermal characteristics and electrical characteristics, such that it is particularly appropriate for a mobile product. Therefore, the fan-out electronic component package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as a Printed circuit board, or the like, having a scale, a purpose, and the like, different from those of the fan-out semiconductor package, and having the fan-in semiconductor package embedded therein.

A new semiconductor package structure that may significantly reduce corrosion and damage of connection pads of a semiconductor chip will be hereinafter described with reference to the drawings.

Figure 9:
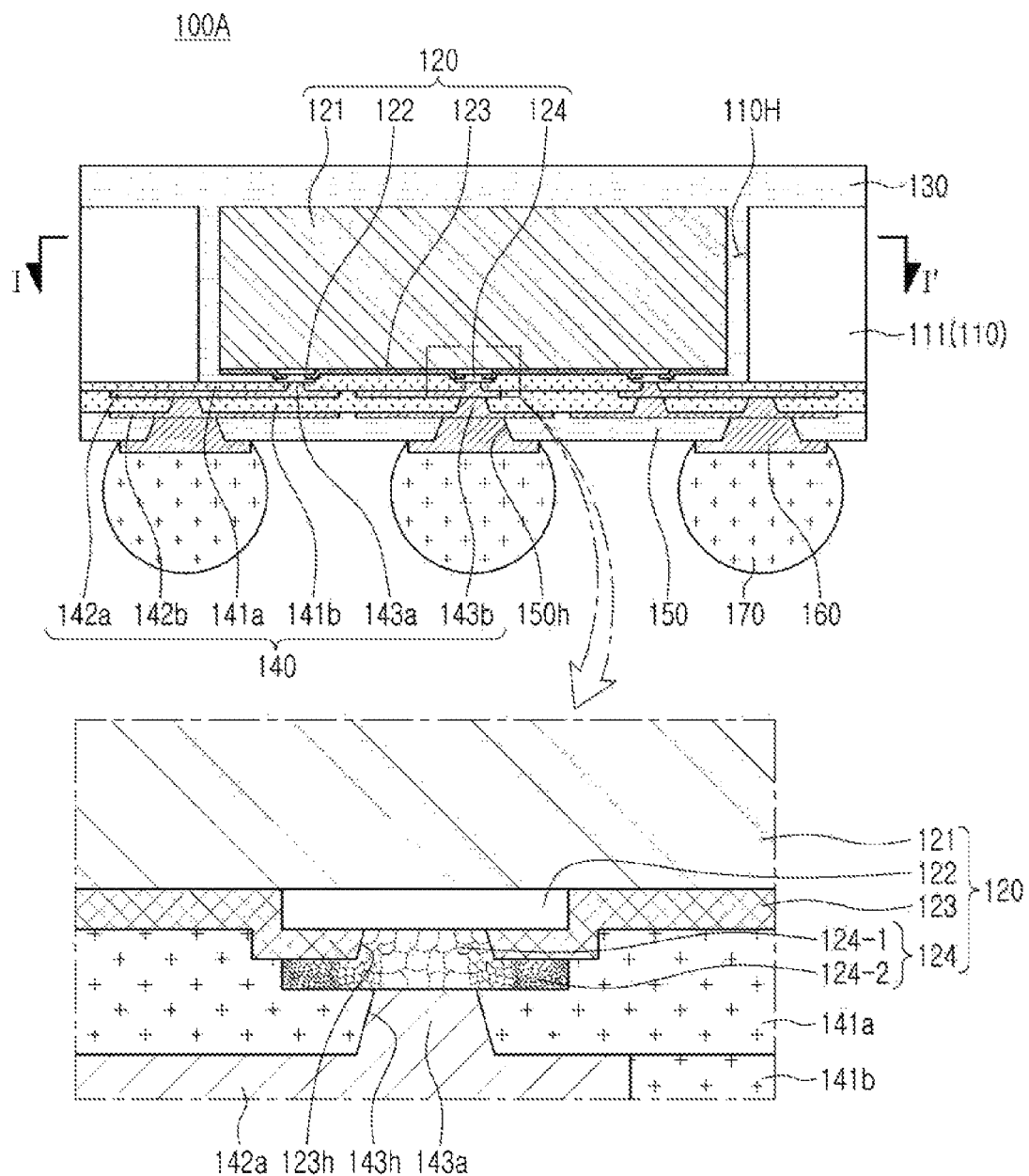
FIG. 9 is a schematic view illustrating an example of a semiconductor package.

FIG. 9 is a schematic view illustrating an example of a semiconductor package.

Figure 10:
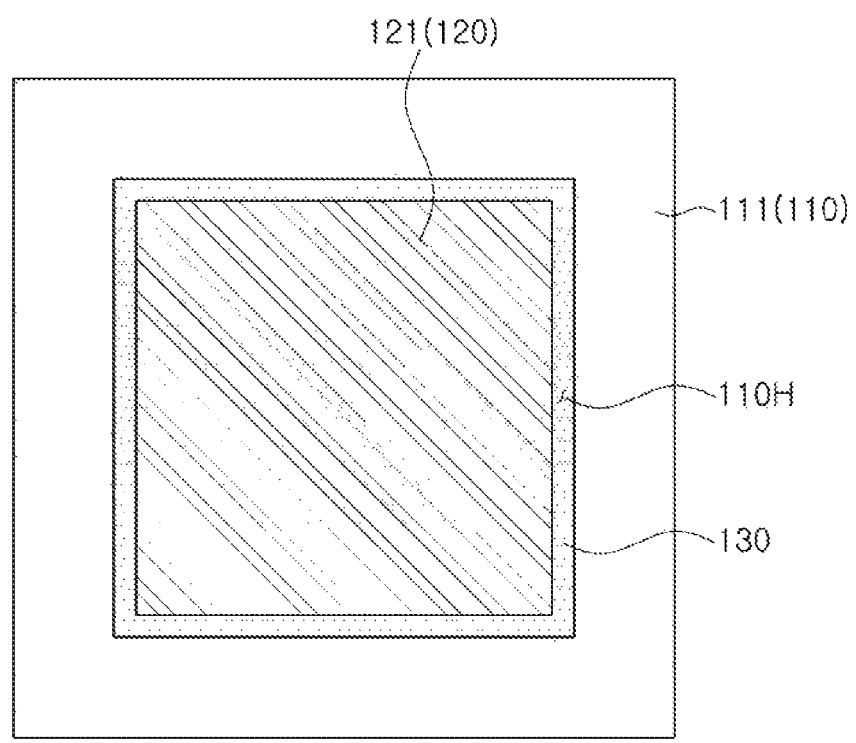
FIG. 10 is a schematic plan view taken along line I-I' of the semiconductor package of FIG. 9.

FIG. 10 is a schematic plan view taken along line I-I' of the semiconductor package of FIG. 9.

Referring to the drawings, a semiconductor package 100A according to an exemplary embodiment may include a semiconductor chip 120 including connection pads 122 disposed on an active surface of the semiconductor chip 120, a passivation layer 123 disposed on the connection pad 122 and the active surface and having openings 123*h* exposing at least portions of the connection pads 122, and capping pads 124 covering the connection pads 122 exposed to the openings 123*h*, an encapsulant 130 covering at least a portion of the semiconductor chip 120, and connection structures 140 including a first insulating layer 141*a* disposed on the active surface of the semiconductor chip 120 and having at least a portion in contact with the capping pads 124, a first redistribution layer 142*a* disposed on the first insulating layer 141*a*, and first connection vias 143*a* penetrating through the first insulating layer 141*a* and connected to the capping pads 124 and the first redistribution layer 142*a*, respectively. Here, the capping pad 124 may have a central portion 124-1 disposed in the opening 123*h*, and a peripheral portion 124-2 extending from the central portion 124-1 onto the passivation layer 123 and having a size of a crystal grain smaller than that of the central portion 124-1.

In the case of the semiconductor chip, a material of the connection pads 122 may be aluminum (Al). In this case, in a process for manufacturing the package 100A, the connection pads 122 of the semiconductor chip 120 are exposed to air, moisture, chemical solution, and the like when no other action is taken, which causes corrosion and damage. Specifically, when the first connection vias 143*a* are directly formed in the semiconductor chip 120 without any action, organic and oxidized layers on the surfaces of the connection pads 122 may be removed through a chemical treatment before an application of the first insulating layer 141*a*, which usually includes a photoimagable dielectric (PID). In this case, the connection pads 122 may be damaged by the chemical treatment. In addition, even when via holes 143*h* are formed in the first insulating layer 141*a* by a photolithography process to form the first connection vias 143*a*, damage to the connection pads 122 may be caused by a PID developer or the like. The damage tends to corrode the connection pads 122 and makes a roughness of the surface of the connection pads 122 tough, which makes a seed layer for forming the first connection vias 143*a* non-uniform. Therefore, when a subsequent packaging process is performed, corrosion of the connection pads 122 may be caused and connection reliability between the semiconductor chip 120 and the connection structures 140 may be reduced.

On the other hand, as in the semiconductor package 100A according to an exemplary embodiment, when the capping pads 124 covering the connection pads 122 exposed to the openings 123*h* of the passivation layer 123 are formed, the connection pads 122 exposed by the openings 123*h* may be covered and may be connected to the first connection vias 143*a*. Therefore, the exposure of the connection pads 122 to air, moisture, chemical solution, and the like in the process of manufacturing the semiconductor package 100A may be significantly reduced, which may significantly reduce corrosion and damage.

Specifically, the capping pads 124 may serve as barriers from oxidation and corrosion of the connection pads 122 which are caused in a process of forming the first insulating layers 141*a* of the connection structures 140. That is, the oxidation and corrosion of the connection pads 122 may be significantly reduced through the capping pads 124 despite an introduction of the first insulation layers 141*a* such as PID for forming the first redistribution layers 142*a*. In this case, the first insulating layers 141*a* may be physically spaced apart from the connection pads 122 by the capping pads 124.

The capping pad 124 applied to the present exemplary embodiment may have a central portion 124-1 disposed in the opening 123*h* of the passivation layer 123, and a peripheral portion 124-2 extending from the central portion 124-1 onto the passivation layer 123 and having a size of a crystal grain smaller than that of the central portion 124-1.

The size of the crystal grain of the central portion 124-1 and the peripheral portion 124-2 may be varied depending on a difference in thickness thereof, a difference in thermal conductivity between components in contact therewith, and a difference in a volume thereof. Specifically, since the peripheral portion 124-2 is in contact with the passivation layer 123 having relatively low thermal conductivity and the central portion 124-1 is in contact with the connection pads 122 having relatively high thermal conductivity, heat may be transferred to the central portion 124-1 more quickly than the peripheral portion 124-2. Therefore, the time at which the central portion 124-1 is exposed to heat is relatively larger than the peripheral portion 124-2. As a result, the crystal grain of the central portion 124-1 may be greater than that of the peripheral portion 124-2. In addition, in the present exemplary embodiment, the capping pad 124 may include copper (Cu) having relatively high thermal conductivity, and the central portion 124-1 may be formed to fill the opening 123h and be formed to have a relatively larger volume than the peripheral portion 124-2. Thereby, the total amount of heat transferred to the central portion 124-1 may be greater than the total amount of heat transferred to the peripheral portion 124-2. As a result, the crystal grain of the central portion 124-1 may be greater than that of the peripheral portion 124-2.

The size of the crystal grain may be determined by, for example, a line intercept method, but is not limited thereto.

A surface roughness of the peripheral portion 124-2 may be greater than that of the central portion 124-1. Since the surface roughness of the peripheral portion 124-2 is relatively greater, a coupling force between the capping pads 124 and the passivation layer 123, and a coupling force between the capping pads 124 and the first insulating layers 141a may be improved. Since the surface roughness of the central portion 124-1 is relatively smaller, a contact resistance between the capping pads 124 and the connection pads 122, and a contact resistance between the capping pads 124 and the first connection vias 143a may be lowered. The surface roughness of the peripheral portion 124-2 may be greater than the surface roughness of the central portion 124-1 because the size of the crystal grain of the peripheral portion 124-2 is smaller than that of the central portion 124-1. That is, the smaller the crystal grain, the greater the number of crystal grains disposed in the same length. As a result, a greater number of grain boundaries may be disposed in the same length. Meanwhile, the surface roughness may be calculated by an arithmetic average method (unit Ra) or a ten-point average method (unit Rz).

A thickness of the peripheral portion 124-2 may be 1.5 μm or more and 6 μm or less. When the peripheral portion 124-2 has a thickness of less than 1.5 μm, the size of the crystal grain is relatively small, and the capping pads 124 may be peeled off. When the peripheral portion 124-2 has a thickness exceeding 6 μm, the total thickness of the semiconductor package may be increased, which may cause a problem in forming the insulating layer.

Meanwhile, the capping pads 124 may be formed on the passivation layer 123 of the semiconductor chip 120 in a chip state before packaging the semiconductor chip 120. In this case, the capping pads 124 as well as the passivation layer 123 may be disposed in a region within the active surface of the semiconductor chip 120, and the encapsulant 130 may cover at least portions of side surfaces of the capping pads 124 as well as side surfaces of the passivation layer 123. As such, since only good products may be selected before packaging by forming the capping pads 124 in the chip state, for example, a wafer state, the yield may be increased and damage or contamination of the connection pads 122 caused by various external factors of the packaging process may be significantly reduced effectively.

The respective components included in the semiconductor package 100A according to the exemplary embodiment will hereinafter be described below in more detail.

A frame 110, which is an additional component, may improve rigidity of the semiconductor package 100A depending on certain materials of an insulating layer 111, and serve to secure uniformity of a thickness of the encapsulant 130. The frame 110 may have a through-hole 110H penetrating through the insulating layer 111. The semiconductor chip 120 may be disposed in the through-hole 110H and a passive component (not illustrated) may also be disposed together therein if necessary. The through-hole 110H may be formed so that an inner wall thereof surrounds the semiconductor chip 120, but is not necessarily limited thereto.

A material of the insulating layer 111 is not particularly limited. For example, an insulating material may be used as the material of the insulating layer 111. In this case, the insulating material may be a thermosetting resin such as an epoxy resin, a thermoplastic resin such as polyimide, a material in which the thermosetting resin or the thermoplastic resin is impregnated together with inorganic filler in a core material such as a glass fiber (a glass cloth or a glass fabric), for example, a copper clad laminate (CCL), an unclad copper clad laminate (CCL), prepreg, or the like, but is not limited thereto. If necessary, the material of the insulating layer 111 may be glass, ceramics, or the like. A lower surface of the insulating layer 111 may be co-planar with the lowest surface of the capping pad 124 of the semiconductor chip 120. This is because a protective layer 124 may be formed in a chip state.

Meanwhile, although not illustrated in the drawings, if necessary, a metal layer (not illustrated) may also be disposed on the wall surfaces of the through-hole 110H of the frame 110, in order to block electromagnetic waves or to dissipate heat, and the metal layer (not illustrated) may surround the semiconductor chip 120.

The semiconductor chip 120 may be an integrated circuit (IC) provided in an amount of several hundreds to several millions or more elements integrated in a single chip. In this case, the IC may be, for example, an application processor chip such as a central processor (for example, a CPU), a graphic processor (for example, a GPU), a digital signal processor, a cryptographic processor, a microprocessor, a microcontroller, or the like, but is not limited thereto. For example, the IC may also be a memory chip such as a power management IC (PMIC), a volatile memory (for example, a DRAM), a non-volatile memory (for example, a ROM), a flash memory, or the like, or a logic chip such as an analog-to-digital converter, an application-specific IC (ASIC), or the like.

The semiconductor chip 120 may be an integrated circuit in a bare state in which a separate bump or wiring layer is not formed. However, the semiconductor chip 120 is not limited thereto, but may also be a packaged type IC, if necessary. The integrated circuit may be formed on the basis of an active wafer. In this case, a base material of the body 121 of the semiconductor chip 120 may be silicon (Si), germanium (Ge), gallium arsenide (GaAs), or the like. Various circuits may be formed on the body 121. The connection pads 122 may electrically connect the semiconductor chip 120 to other components. A material of each of the connection pads 122 may be a metal material such as aluminum (Al), copper (Cu), or the like without being particularly limited. The passivation layer 123 having openings 123h exposing at least portions of the connection pads 122 may be formed on the body 121, and may be an oxide film, a nitride film, or the like. Although the passivation layer 123 is illustrated as having a thickness similar to that of each of the connection pads 122 in the drawing, the passivation layer 123 may be thinner than each of the connection pads 122. The capping pads 124 covering the connection pads 122 exposed to the openings 123h may be formed in the openings 123h of the passivation layer 123, and may be formed of a material including copper (Cu). An insulating layer (not illustrated), or the like such as SiO may be further disposed between the body 121 and the connection pads 122 or between the body 121 and the passivation layer 123. Meanwhile, a surface of the semiconductor chip 120 on which the connection pads 122 are disposed may be an active surface, and a surface of the semiconductor chip 120 opposing the active surface may be an inactive surface.

The encapsulant 130 may cover at least a portion of the semiconductor chip 120. When the frame is present, the encapsulant 130 may cover at least a portion of the frame 110. In addition, the encapsulant 130 may fill at least a portion of the through-hole 110H. The encapsulant 130 may include an insulating material, and the insulating material may be a material including inorganic filler and an insulating resin, for example, a thermosetting resin such as an epoxy resin, a thermoplastic resin such as polyimide, a resin having a reinforcing material such as inorganic filler included in the thermosetting resin and the thermoplastic resin, such as Ajinomoto Build-up Film (ABF), FR-4, Bismaleimide Triazine (BT) resin, or the like. In addition, a molding material such as an epoxy molding compound (EMC) may be used, and a photoimagable dielectric material, that is, a photoimagable encapsulant (PIE) may also be used, if necessary. If necessary, a material in which an insulating resin such as a thermosetting resin or a thermoplastic resin is impregnated in inorganic filler and/or a core material such as a glass fiber (a glass cloth or a glass fabric) may also be used as the insulating material.

The connection structures 140 may be connected to the capping pads 124 of the semiconductor chip 120 to redistribute the connection pads 122 connected to the capping pads 124. Several tens to several thousands of connection pads 122 of the semiconductor chip 120 having various functions may be redistributed by the connection structures 140, and may be physically and/or electrically externally connected through the electrical connection metals 170 depending on the functions. The connection structure 140 may include a first insulating layer 141a disposed on the active surface of the semiconductor chip 120 and having at least a portion in contact with the capping pad 124, a first redistribution layer 142a disposed on the first insulating layer 141a, a first connection via 143a penetrating through the first insulating layer 141a and connected to the capping pad and the first redistribution layer 142a, respectively, a second insulating layer disposed on the first insulating layer 141a and covering at least a portion of the first redistribution layer 142a, a second redistribution layer 142b disposed on the second insulating layer 141b, and a second connection via 143b penetrating through the second insulating layer 141b and electrically connected the first and second redistribution layers 142a and 142b to each other. The first connection via 143a may be formed by forming a via hole 143h in the first insulating layer 141a to expose at least a portion of the capping pad 124 and then filling a conductive material in at least a portion of the via hole 143h. Meanwhile, the number of the insulating layers 141a and 141b, the redistribution layers 142a and 142b, and the connection vias 143a and 143b described above may be greater or smaller than that illustrated in the drawing.

An insulating material may be used as a material of each of the first and second insulating layers 141a and 141b. In this case, a photoimagable dielectric (PID) may be used as the insulating material. In this case, a fine pitch may be introduced through a photo via. In addition, a plurality of via holes may be simultaneously formed in a single insulating layer by a single photolithography process. Therefore, several tens to several millions of connection pads 122 of the semiconductor chip 120 may be very effectively redistributed. The first and second insulating layers 141a and 141b may be bounded to each other. The first insulating layer 141a may be physically spaced apart from the connection pads 122 by the capping pads 124.

The first and second redistribution layers 142a and 142b may redistribute the connection pads 122 of the semiconductor chip 120 to electrically connect the connection pads 122 to the electrical connection metals 170. A material of the first and second redistribution layer 142a and 142b may be a metal material such as copper (Cu), aluminum (Al), silver (Ag), tin (Sn), gold (Au), nickel (Ni), lead (Pb), titanium (Ti), or alloys thereof. The first and second redistribution layers 142a and 142b may perform various functions depending on designs. For example, the first and second redistribution layers 142a and 142b may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the first and second redistribution layers 142a and 142b may include via pads, electrical connection metal pads, and the like.

The first and second connection vias 143a and 143b may electrically connect the connection pads 122 of the semiconductor chip 120 and the first redistribution layer 142a formed on different layers to each other, and may also electrically connect the first and second redistribution layers 142a and 142b formed on different layers to each other. Specifically, the first connection via 143a may be in contact with the capping pads 124 of the semiconductor chip 120, and the second connection via 143b may be in contact with the first redistribution layer 142a. A material of each of the connection vias 143a and 143b may be similarly a metal material such as copper (Cu), aluminum (Al), silver (Ag), tin (Sn), gold (Au), nickel (Ni), lead (Pb), titanium (Ti), or alloys thereof. Each of the first and second connection vias 143a and 143b may be a field type in which the via hole is completely filled with the metal material, and may also be a conformal type in which the metal material is plated along a wall surface of the via hole. In addition, each of the first and second connection vias 143a and 143b may have a tapered shape.

Meanwhile, the first redistribution layer 142a and the first connection via 143a may be simultaneously formed by a plating process and may be integrated with each other. In this case, the first redistribution layer 142a and the first connection via 143a may include a seed layer and a plating layer formed on the seed layer. Specifically, the seed layer may be formed to be very thin on the surface of the capping pad 124 exposed by the via hole 143h of the first insulating layer 141a, the inner wall of the via hole 143h, and the surface of the first insulating layer 141a by sputtering or the like, and may include a titanium (Ti) layer or a double layer of titanium (Ti)/Copper (Cu). The plating layer may be formed on the seed layer by electroplating or the like and may fill the via hole 143h and the second opening 124h. The second redistribution layer 142b and the second connection via 143b may also be simultaneously formed by a plating process and may be integrated with each other. In this case, the second redistribution layer 142b and the second connection via 143b may include a seed layer and a plating layer.

The passivation layer 150, which is an additional component, may protect the connection structures 140 from external physical or chemical damage. The passivation layer 150 may include an insulating resin and inorganic filler, but may not include a glass fiber. For example, the passivation layer 150 may be formed of ABF, but is not limited thereto. The passivation layer 150 may have a third opening 150h that opens at least a portion of the second redistribution layer 142b.

The underbump metals 160, which are also additional components, may improve connection reliability of the electrical connection metals 170 to improve board level reliability of the semiconductor package 100A according to an exemplary embodiment. The number of underbump metals 160 may be several tens to tens of thousands. Each of the underbump metals 160 may be connected to the second redistribution layer 142b through the third opening 150h penetrating through the passivation layer 150. The underbump metals 160 may be formed by the known metallization method using a metal, but is not limited thereto.

The electrical connection metals 170 may be configured to physically and/or electrically externally connect the semiconductor package 100A. For example, the semiconductor package 100A may be mounted on a main board of the electronic device through the electrical connection metals 170. The electrical connection metals 170 may be formed of a low-melting point metal, for example, tin (Sn) or an alloy containing tin (Sn). More specifically, the electrical connection metals 170 may be formed of a solder, or the like. However, this is only an example, and a material of each of the electrical connection metals 170 is not particularly limited thereto. Each of the electrical connection metals 170 may be a land, a ball, a fin, or the like. The electrical connection metals 170 may be formed as a multilayer or single layer structure. When the electrical connection metals 170 are formed as a multilayer structure, the electrical connection metals 170 may include a copper (Cu) pillar and a solder. When the electrical connection metals 170 are formed as a single layer structure, the electrical connection metals 170 may include a tin-silver solder or copper (Cu). However, this is merely an example, and a material of each of the electrical connection metals 170 is not limited thereto. The number, an interval, a disposition form, and the like, of electrical connection metals 170 are not particularly limited, but may be sufficiently modified depending on design particulars by those skilled in the art. For example, the electrical connection metals 170 may be provided in an amount of several tens to several thousands according to the number of connection pads 122, or may also be provided in an amount of several tens to several thousands or more or several tens to several thousands or less.

At least one of the electrical connection metals 170 may be disposed in a fan-out region. The fan-out region is a region except for a region in which the semiconductor chip 120 is disposed. That is, the semiconductor package 100A according to the exemplary embodiment may be a fan-out semiconductor package. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness, and may have price competitiveness.

Figure 11:
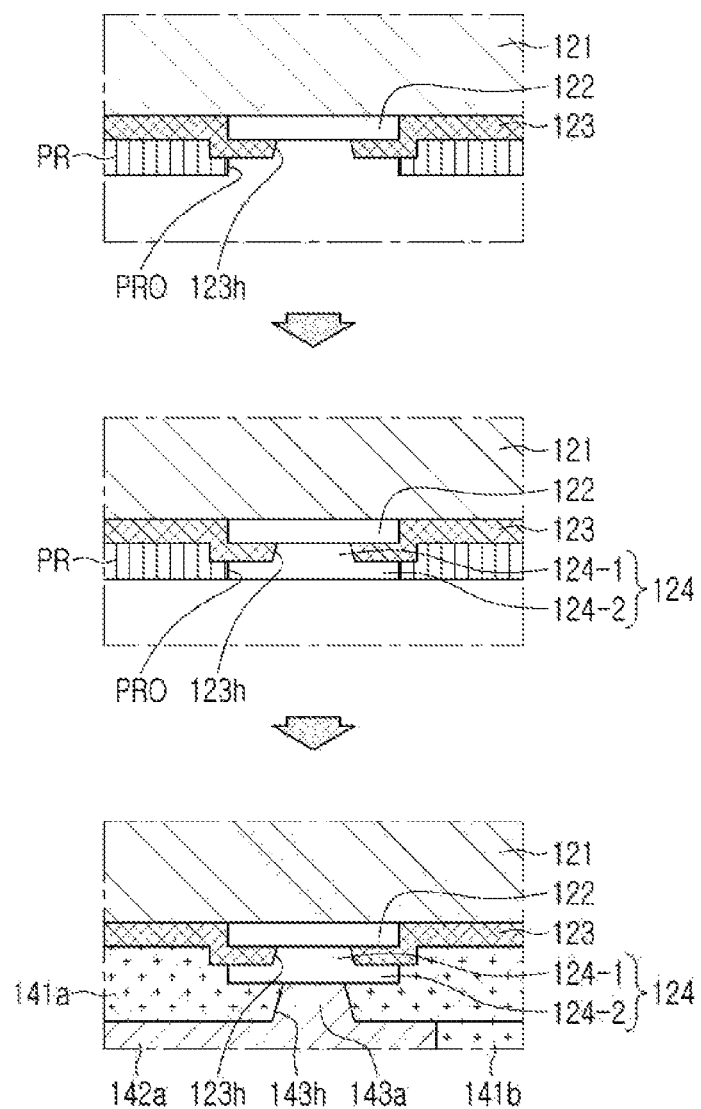
FIG. 11 is schematic views illustrating some of processes of manufacturing the semiconductor package of FIG. 9.

FIG. 11 is schematic views illustrating some of processes of manufacturing the semiconductor package of FIG. 9.

Referring to FIG. 11, a photoresist PR having an opening portion PRO may be formed on the passivation layer 123 in a chip state, for example, a wafer state. The opening portion PRO of the photoresist PR may have a diameter greater than that of the opening 123h of the passivation layer 123 to expose at least a portion of the passivation layer 123 formed on the connection pads 122. Next, the capping pad 124 filling the opening 123h and the opening portion PRO may be formed. The peripheral portion 124-2 of the capping pad 124 may be disposed in the passivation layer 123 exposed to the opening portion PRO, and the central portion 124-1 of the capping pad 124 may be disposed in the opening 123h. Next, the photoresist PR may be removed.

Thereafter, a packaging process of the semiconductor chip 120 is performed. First, a first insulating layer 141a may be formed on the capping pad 124. Here, since the connection pad 122 is covered with the capping pad 124, a contamination problem which is caused in a process of forming the first insulating layer 141a and the via hole 143h may be significantly reduced. After the first insulating layer 141a is formed, a via hole 143h may be formed by a photolithography method. Next, a seed layer may be formed by sputtering or the like, and a first connection via 143a filling the via hole 143h and a first redistribution layer 142a disposed on the first insulating layer 141a may be formed by a plating process such as a semi additive process (SAP) or a modified semi additive process (MSAP). Thereafter, a second insulating layer 141b or the like may be formed.

As described through a series of processes, since the connection pad 122 is first protected with the capping pad 124 in the chip state and the connection structure 140 is then formed, the contamination problem of the connection pad 122 may be effectively solved such that reliability may be improved and resistance distribution may be reduced.

Meanwhile, in the description described above, when the capping pad 124 is formed by plating, the capping pad may include a seed layer and a plating layer. In this case, the seed layer may be formed on the passivation layer 123, the opening 123h, and the surface of the connection pad 122 exposed to the opening, by a sputtering process before the process of forming the photoresist PR. After the removal of the photoresist PR, a part of the seed layer that is not covered by the plating layer may be removed by etching or the like.

In addition, in the description described above, after the capping pad 124 is formed by plating, a heat treatment process may be added. This may cause a difference in the size of the crystal grain within the capping pad 124. However, the scope of the present disclosure is not limited thereto. For example, when the temperature and time in an electrolytic plating process for forming the plating layer of the capping pad 124 are sufficient for crystal growth of the capping pad 124, the above-described heat treatment process may be omitted. The heat treatment process may be added to any process after the process of forming the capping pads 124.

Figure 12:
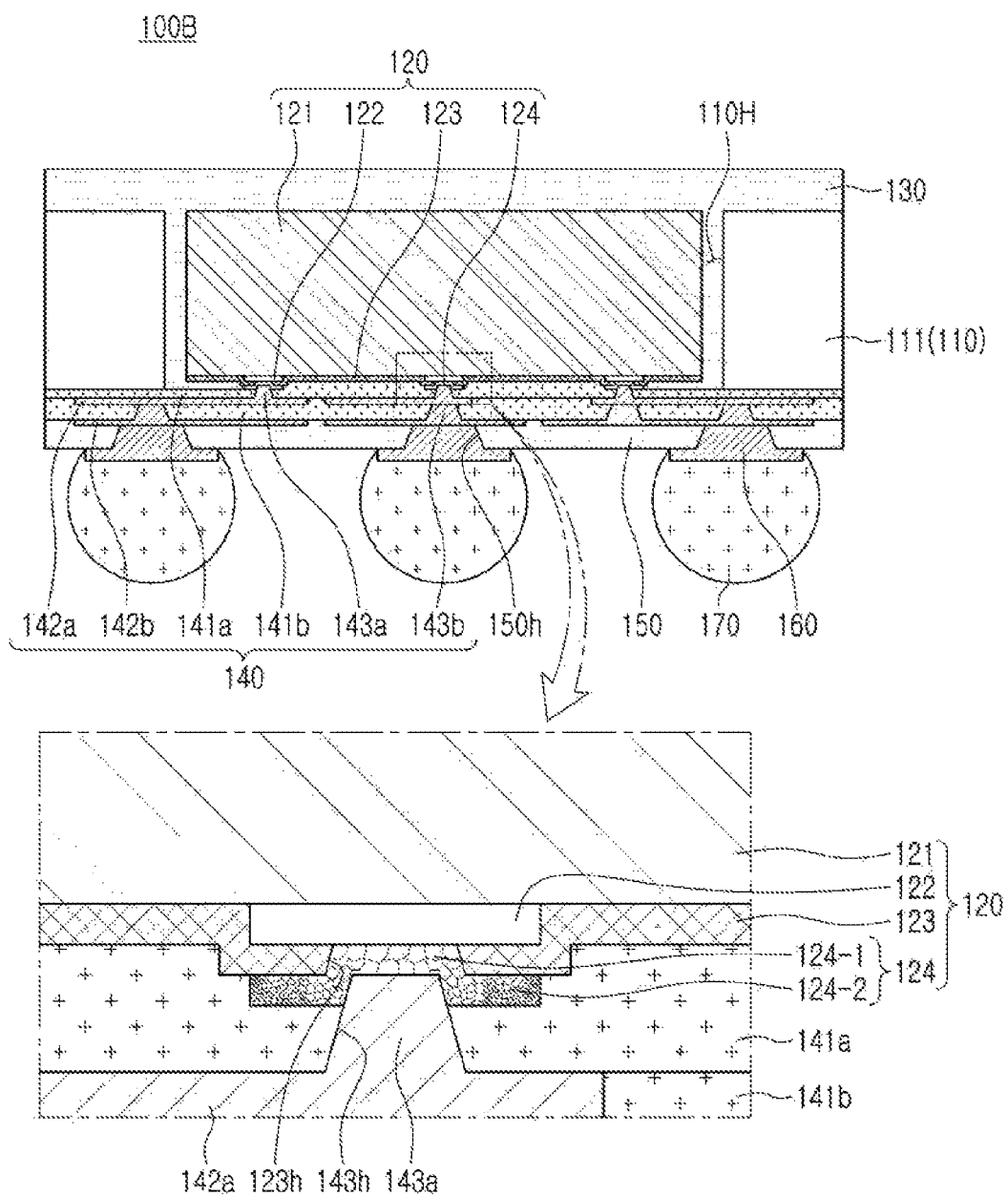
FIG. 12 is a schematic view illustrating another example of the semiconductor package.

FIG. 12 is a schematic view illustrating another example of a semiconductor package.

Referring to FIG. 12, a capping pad 124 of a semiconductor package 100B according to another exemplary embodiment may have a form different from that of the semiconductor package 100A according to the exemplary embodiment described above.

The capping pad 124 may have a recess on a surface thereof connected to a connection via 143a, and the recess may be arranged in a portion corresponding to the opening 123h of the passivation layer 123. The capping pad 124 may have this recess when a stepped portion of the passivation layer 123 is relatively thick.

Specifically, the capping pad 124 may be formed to correspond to shapes of the passivation layer 123, the inner wall of the opening 123h, and a bottom surface of the opening 123h. That is, the capping pad 124 may be formed in the form of a conformal film. Therefore, a shape of one surface of the capping pad 124 which is in contact with the passivation layer 123, the inner wall of the opening 123h, and the bottom surface of the opening 123h may correspond to a shape of the other surface of the capping pad 124 opposing one surface of the capping pad 124. Since the capping pad 124 is formed in the form of the conformal film, damage and contamination of the connection pad 122 may be prevented and the total thickness of the package may be reduced. In addition, a signal transmission path between the connection structure 140 and the connection pad 122 may be relatively shortened to improve signal transmission efficiency.

Other contents are substantially the same as those described above with reference to FIGS. 9 through 12, and a detailed description thereof is thus omitted.

Figure 13:
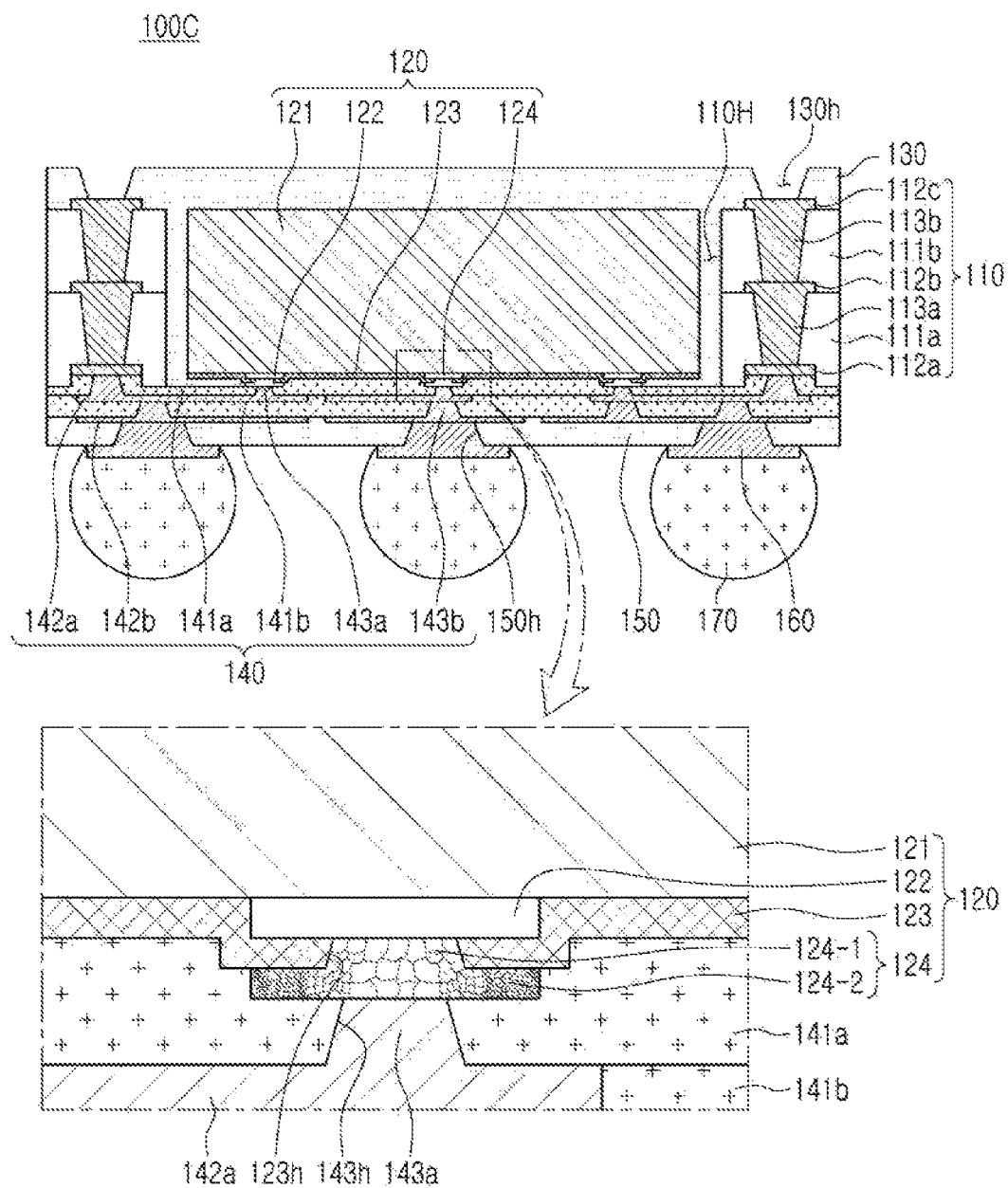
FIG. 13 is a schematic view illustrating another example of the semiconductor package.

FIG. 13 is a schematic view illustrating another example of a semiconductor package.

Referring to FIG. 13, a frame 110 of a semiconductor package 100C according to another exemplary embodiment may have a form different from that of the semiconductor package 100A according to the exemplary embodiment described above.

Specifically, the frame 110 may include a plurality of wiring layers 112a, 112b, and 112c electrically connected to the connection pads 122. That is, the frame 110 may include the wiring layers 112a, 112b, and 112c and wiring vias 113a and 113b in addition to the insulating layers 111a and 111b, and may thus serve as the connection structure. In this case, the wiring layers 112a, 112b, and 112c and the wiring vias 113a and 113b may serve as electrical connection members.

More specifically, the frame 110 may include a first insulating layer 111a having one surface in contact with the connection structure 140, a first wiring layer 112a in contact with the connection structure 140 and embedded in the first insulating layer 111a, a second wiring layer 112b disposed on the other surface of the first insulating layer 111a opposing one surface of the first insulating layer 111a, a second insulating layer 111b disposed on the other surface of the first insulating layer 111a and covering the second wiring layer 112b, and a third wiring layer 112c disposed on the second insulating layer 111b. The first and second wiring layers 112a and 112b and the second and third wiring layers 112b and 112c may be electrically connected to each other through first and second wiring vias 113a and 113b penetrating through the first and second insulating layers 111a and 111b, respectively. The first to third wiring layers 112a, 112b, and 112c may be electrically connected to the connection pads 122 through the first and second redistribution layers 142a and 142b of the connection structure 140.

A material of each of the first and second insulating layers 111a and 111b is not particularly limited. For example, an insulating material may be used as the material of the first and second insulating layers 111a and 111b. In this case, a thermosetting resin such as an epoxy resin, a thermoplastic resin such as polyimide, a resin in which the thermosetting resin and the thermoplastic resin are mixed with inorganic filler, for example, an Ajinomoto Build-up Film (ABF), or the like, may be used as the insulating material. Alternatively, a material in which the above-mentioned resins are impregnated together with inorganic filler in a core material such as a glass fiber (a glass cloth or a glass fabric), for example, prepreg, or the like, may also be used as the insulating material. One surface of the first insulating layer 111a may be co-planar with the lowest surface of the capping pad 124 of the semiconductor chip 120. This is because the capping pad 124 may be formed in the chip state.

The first to third wiring layers 112a, 112b, and 112c may provide upper/lower portion electrical connection paths of the package together with the first and second wiring vias 113a and 113b, and may serve to redistribute the connection pads 122. A material of each of the first to third wiring layers 112a, 112b, and 112c may be a metal material such as copper (Cu), aluminum (Al), silver (Ag), tin (Sn), gold (Au), nickel (Ni), lead (Pb), titanium (Ti), or alloys thereof. Each of the first to third wiring layers 112a, 112b, and 112c may perform various functions depending on a design of the corresponding layer. For example, the first to third wiring layers 112a, 112b, and 112c may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the first to third wiring layers 112a, 112b, and 112c may include via pads, wire pads, electrical connection metal pads, and the like. The first to third wiring layers 112a, 112b, and 112c may be formed by a known plating process, and may each include a seed layer and a plating layer. A thickness of each of the first to third wiring layers 112a, 112b, and 112c may be greater than that of each of the first and second redistribution layers 142a and 142b. The first wiring layer 112a may be recessed into the first insulating layer 111a. As described above, when the first wiring layer 112a is recessed into the first insulating layer 111a and a lower surface of the first insulating layer 111a and a lower surface of the first wiring layer 112a have a step therebetween, a phenomenon in which a material of the encapsulant 130 bleeds to pollute the first wiring layer 112a may be prevented.

The first and second wiring vias 113a and 113b may electrically connect the first to third wiring layers 112a, 112b, and 112c formed on different layers to each other, resulting in electrical paths in the frame 110. A material of each of the first and second wiring vias 113a and 113b may be a metal material such as copper (Cu), aluminum (Al), silver (Ag), tin (Sn), gold (Au), nickel (Ni), lead (Pb), titanium (Ti), or alloys thereof. Each of the first and second wiring vias 113a and 113b may be a field type via filled with a metal material, and may also be a conformal type via in which the metal material is formed along a wall surface of a via hole. In addition, each of the first and second wiring vias 113a and 113b may have a tapered shape. The first and second wiring vias 113a and 113b may also be formed by a plating process, and may each include a seed layer and a plating layer.

When a hole for the first wiring via 113a is formed, some of the pads of the first wiring layer 112a may serve as a stopper, and it may thus be advantageous in a process that the first wiring via 113a has the tapered shape of which a width of an upper surface is greater than that of a lower surface. In this case, the first wiring via 113a may be integrated with pad patterns of the second wiring layer 112b. In addition, when a hole for the second wiring via 113b is formed, some of the pads of the second wiring layer 112b may serve as a stopper, and it may thus be advantageous in a process that the second wiring via 113b has the tapered shape of which a width of an upper surface is greater than that of a lower surface. In this case, the second wiring via 113b may be integrated with pad patterns of the third wiring layer 112c.

The encapsulant 130 may have a fourth opening 130h exposing at least a portion of the third wiring layer 112c of the frame 110, and a surface treatment layer may be formed on the surface of the third wiring layer 112c exposed by the fourth opening 130h. The surface treatment layer may include nickel (Ni)/gold (Au) or the like or may include an organic material. When the surface treatment layer includes nickel (Ni)/gold (Au) or the like, the surface treatment layer may be, for example, an electroless nickel immersion gold (ENIG) layer, or may be an electroless nickel electroless palladium immersion gold (ENEPIG) layer. When the surface treatment layer includes the organic material, the surface treatment layer may be an organic solderability preservative (OSP) layer.

Other contents are substantially the same as those described above with reference to FIGS. 9 through 13, and a detailed description thereof is thus omitted.

Figure 14:
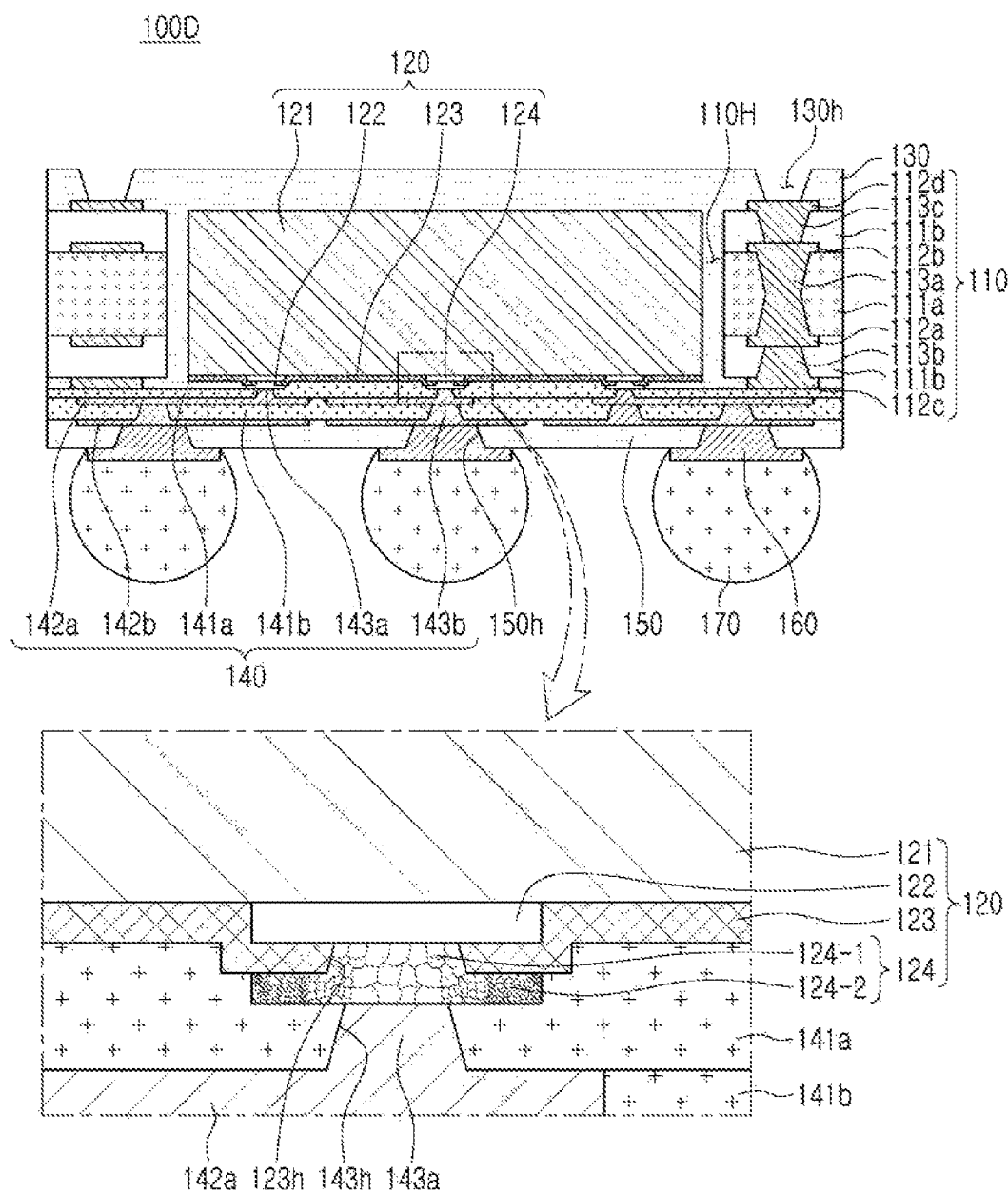
FIG. 14 is a schematic view illustrating another example of the semiconductor package.

FIG. 14 is a schematic view illustrating another example of a semiconductor package.

Referring to FIG. 14, a frame 110 of a semiconductor package 100D according to another exemplary embodiment may also have a form different from that of the semiconductor package 100A according to the exemplary embodiment described above.

Specifically, the frame 110 may include a plurality of wiring layers 112a, 112b, 112c, and 112d electrically connected to the connection pads 122. That is, the frame 110 may include the wiring layers 112a, 112b, 112c, and 112d and wiring vias 113a, 113b, and 113c in addition to the insulating layers 111a, 111b, and 111c, and may thus serve as the connection structure. In this case, the wiring layers 112a, 112b, 112c, and 112d and the wiring vias 113a, 113b, and 113c may serve as electrical connection members.

More specifically, the frame 110 may include a first insulating layer 111a, a first wiring layer 112a disposed on a lower surface of the first insulating layer 111a, a second wiring layer 112b disposed on an upper surface of the first insulating layer 111a, a second insulating layer 111b disposed on the lower surface of the first insulating layer 111a and covering at least a portion of the first wiring layer 112a, a third wiring layer 112c disposed on a lower surface of the second insulating layer 111b, a third insulating layer 111c disposed on the upper surface of the first insulating layer 111a and covering at least a portion of the second wiring layer 112b, a fourth wiring layer 112d disposed on an upper surface of the third insulating layer 111c, a first wiring via 113a penetrating through the first insulating layer 111a and electrically connecting the first and second wiring layers 112a and 112b to each other, a second wiring via 113b penetrating through the second insulating layer 111b and electrically connecting the first and third wiring layers 112a and 112c to each other, and a third wiring via 113c penetrating through the third insulating layer 111c and electrically connecting the second and fourth wiring layers 112b and 112d to each other. Since the frame 110 may include a larger number of wiring layers 112a, 112b, 112c, and 112d, the connection structure 140 may be further simplified.

The first insulating layer 111a may have a thickness greater than that of each of the second insulating layer 111b and the third insulating layer 111c. The first insulating layer 111a may be basically relatively thick in order to maintain rigidity, and the second insulating layer 111b and the third insulating layer 111c may be introduced in order to form a larger number of wiring layers 112c and 112d. Similarly, the first wiring via 113a penetrating through the first insulating layer 111a may have a diameter greater than that of each of the second and third wiring vias 113b and 113c penetrating through the second and third insulating layers 111b and 111c. In addition, the first wiring via 113a may have an hourglass or cylinder shape, while the second and third wiring vias 113b and 113c may have tapered shapes of which directions are opposite to each other. A thickness of each of the first to fourth wiring layers 112a, 112b, 112c, and 112d may be greater than that of each of the first and second redistribution layers 142a and 142b. A lower surface of the third wiring layer 112c may be coplanar with the lowest surface of the capping pad 124 of the semiconductor chip 120. This is because the capping pad 124 may be formed in the chip state. Other contents including a material or a role of each of the first to fourth wiring layers 112a, 112b, 112c, and 112d, and the first to third wiring vias 113a, 113b, and 113c, and the fourth opening 130h are substantially the same as those described above with reference to FIGS. 9 to 14, and a detailed description thereof is thus omitted.

In the present disclosure, terms "lower side", "lower portion", "lower surface", and the like, have been used to indicate a downward direction in relation to cross sections of the drawings, and terms "upper side", "upper portion", "upper surface", and the like, have been used to indicate a direction opposing the direction indicated by the terms "lower side", "lower portion", "lower surface", and the like. However, these directions are defined for convenience of explanation, and the claims are not particularly limited by the directions defined as described above, and the concept of the upper portion and the lower portion may be changed at any time.

The meaning of a "connection" of a component to another component in the description includes an indirect connection through an adhesive layer as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first component may be named a second component and a second component may also be similarly named a first component, without departing from the scope of the present disclosure.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

As set forth above, according to the exemplary embodiments in the present disclosure, the new semiconductor package structure that may significantly reduce corrosion and damage of connection pads of the semiconductor chip, and enable improvement in reliability and reduction in resistance distribution of the connection vias may be provided.

While exemplary embodiments have been shown and described above, it will be apparent to those skilled in the art that modifications and variations could be made without departing from the scope of the present invention as defined by the appended claims.

What is claimed is:

1. A semiconductor package comprising:
a semiconductor chip including a connection pad disposed on an active surface of the semiconductor chip, a passivation layer disposed on the connection pad and the active surface and having an opening exposing at least a portion of the connection pad, and a capping pad covering the connection pad exposed to the opening;
an encapsulant covering at least a portion of the semiconductor chip; and
a connection structure disposed on the active surface of the semiconductor chip and including a connection via connected to the capping pad and a redistribution layer connected to the connection via,
wherein the capping pad includes:
a central portion disposed in the opening, and
a peripheral portion extending from the central portion onto the passivation layer, and having a crystal grain having a size different from that of a crystal grain of the central portion.

2. The semiconductor package of claim 1, wherein the size of the crystal grain of the central portion is greater than the size of the crystal grain of the peripheral portion.

3. The semiconductor package of claim 1, wherein a surface roughness of the peripheral portion is greater than a surface roughness of the central portion.

4. The semiconductor package of claim 1, wherein the central portion fills the opening.

5. The semiconductor package of claim 1, wherein a shape of the central portion of the capping pad corresponds to an area defined by an inner wall surface of the opening and a bottom surface of the opening.

6. The semiconductor package of claim 1, wherein the peripheral portion has a thickness of 1.5 μm or more and 6 μm or less.

7. The semiconductor package of claim 1, wherein at least a portion of the encapsulant is arranged between the passivation layer and the connection structure.

8. The semiconductor package of claim 7, wherein the capping pad has one surface in contact with the connection pad, and another surface opposing the one surface, and the encapsulant covers at least a portion of the capping pad and exposes the another surface of the capping pad.

9. The semiconductor package of claim 1, wherein the connection structure further includes an insulating layer disposed on the active surface of the semiconductor chip and having at least a portion in contact with the capping pad,
the redistribution layer is disposed on the insulating layer, and
the connection via penetrates through the insulating layer and connects the capping pad and the redistribution layer to each other.

10. The semiconductor package of claim 9, wherein at least a portion of the encapsulant is arranged between the passivation layer and the insulating layer.

11. The semiconductor package of claim 1, further comprising a frame having a through-hole,
wherein the semiconductor chip is disposed in the through-hole, and
at least a portion of the encapsulant is disposed in the through-hole.

12. The semiconductor package of claim 11, wherein the frame includes:
a first insulating layer having one surface in contact with the connection structure;
a first wiring layer embedded in the first insulating layer and in contact with the connection structure;
a second wiring layer disposed on another surface of the first insulating layer opposing the one surface of the first insulating layer;
a second insulating layer disposed on the another surface of the first insulating layer and covering the second wiring layer; and
a third wiring layer disposed on the second insulating layer,
wherein the first to third wiring layers are electrically connected to the connection pad.

13. The semiconductor package of claim 11, wherein the frame includes:
a first insulating layer;
a first wiring layer disposed on a lower surface of the first insulating layer;
a second wiring layer disposed on an upper surface of the first insulating layer;
a second insulating layer disposed on the lower surface of the first insulating layer and covering the first wiring layer;
a third wiring layer disposed on a lower surface of the second insulating layer;
a third insulating layer disposed on the upper surface of the first insulating layer and covering the second wiring layer; and
a fourth wiring layer disposed on an upper surface of the third insulating layer,
wherein the first to fourth wiring layers are electrically connected to the connection pad.

14. The semiconductor package of claim 1, wherein the capping pad has a recess on a surface thereof connected to the connection via, and the recess is arranged in a portion corresponding to the opening of the passivation layer.

15. A semiconductor package comprising:
a semiconductor chip including a connection pad disposed on an active surface of the semiconductor chip, a passivation layer disposed on the connection pad and the active surface, and a capping pad covering a first portion of the connection pad;
an encapsulant covering at least a portion of the semiconductor chip; and
a connection structure disposed on the active surface of the semiconductor chip and including a connection via connected to the capping pad and a redistribution layer connected to the connection via,
wherein the passivation layer has a stepped portion that covers a second portion of the connection pad,
the stepped portion of the passivation layer is disposed between the second portion of the connection pad and the capping pad in a stacking direction, and
a first portion of the capping pad in contact with the connection pad has a crystal grain having a size different than that of a size of a crystal grain of a second portion of the capping pad disposed directly below the stepped portion of the passivation layer in the stacking direction.

16. The semiconductor package of claim 15, wherein the size of the crystal grain of the first portion of the capping pad is greater than the size of the crystal grain of the second portion of the capping pad.

17. The semiconductor package of claim 15, wherein a surface roughness of the second portion of the capping pad is greater than a surface roughness of the first portion of the capping pad.

18. The semiconductor package of claim 15, wherein the connection structure further includes an insulating layer disposed on the active surface of the semiconductor chip and having at least a portion in contact with the capping pad,
the redistribution layer is disposed on the insulating layer, and
the connection via penetrates through the insulating layer and connects the capping pad and the redistribution layer to each other.

19. The semiconductor package of claim 18, wherein at least a portion of the encapsulant is arranged between the passivation layer and the insulating layer.

20. The semiconductor package of claim 15, further comprising a frame having a through-hole,
wherein the semiconductor chip is disposed in the through-hole,
at least a portion of the encapsulant is disposed in the through-hole, and
the frame includes:
a first insulating layer having one surface in contact with the connection structure;
a first wiring layer embedded in the first insulating layer and in contact with the connection structure;
a second wiring layer disposed on another surface of the first insulating layer opposing the one surface of the first insulating layer;
a second insulating layer disposed on the another surface of the first insulating layer and covering the second wiring layer; and
a third wiring layer disposed on the second insulating layer,
wherein the first to third wiring layers are electrically connected to the connection pad.

* * * * *